United States Patent
Lee et al.

(10) Patent No.: US 7,879,676 B2
(45) Date of Patent: Feb. 1, 2011

(54) HIGH DENSITY TRENCH MOSFET WITH SINGLE MASK PRE-DEFINED GATE AND CONTACT TRENCHES

(75) Inventors: Yeeheng Lee, San Jose, CA (US); Hong Chang, Cupertino, CA (US); Tiesheng Li, San Jose, CA (US); John Chen, Palo Alto, CA (US); Anup Bhalla, Santa Clara, CA (US)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/847,863

(22) Filed: Jul. 30, 2010

(65) Prior Publication Data

US 2010/0291744 A1    Nov. 18, 2010

Related U.S. Application Data

(63) Continuation of application No. 12/362,414, filed on Jan. 29, 2009, now Pat. No. 7,767,526.

(51) Int. Cl.
*H01L 21/336* (2006.01)
(52) U.S. Cl. .............. 438/268; 438/206; 438/209; 438/212; 257/E29.262
(58) Field of Classification Search .......... 438/206, 438/209, 212, 268; 257/E29.262
See application file for complete search history.

(56) References Cited

U.S. PATENT DOCUMENTS

| | | |
|---|---|---|
| 2006/0145247 A1 | 7/2006 | Zundel et al. |
| 2007/0173015 A1 | 7/2007 | Im |
| 2008/0157194 A1 | 7/2008 | Lee et al. |
| 2009/0020810 A1 | 1/2009 | Marchant |
| 2009/0065814 A1 | 3/2009 | Bhalla et al. |

OTHER PUBLICATIONS

U.S. Appl. No. 12/362,414, filed Jan. 29, 2009.
Notice of Allowance and Fee(s) Due dated Apr. 5, 2010 issued for U.S. Appl. No. 12/362,414.

*Primary Examiner*—George Fourson
*Assistant Examiner*—John M Parker
(74) *Attorney, Agent, or Firm*—Joshua D. Isenberg; JDI Patent

(57) ABSTRACT

Trench gate MOSFET devices may be formed using a single mask to define gate trenches and body contact trenches. A hard mask is formed on a surface of a semiconductor substrate. A trench mask is applied on the hard mask to predefine a body contact trench and a gate trench. These predefined trenches are simultaneously etched into the substrate to a first predetermined depth. A gate trench mask is next applied on top of the hard mask. The gate trench mask covers the body contact trenches and has openings at the gate trenches. The gate trench, but not the body contact trench, is etched to a second predetermined depth. Conductive material of a first kind may fill the gate trench to form a gate. Conductive material of a second kind may fill the body contact trench to form a body contact.

20 Claims, 7 Drawing Sheets

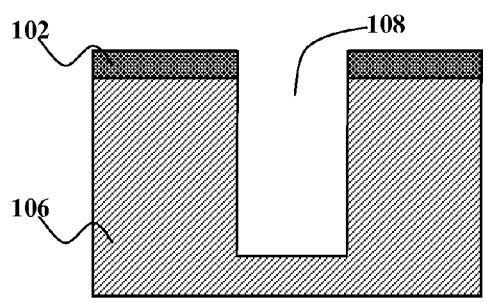
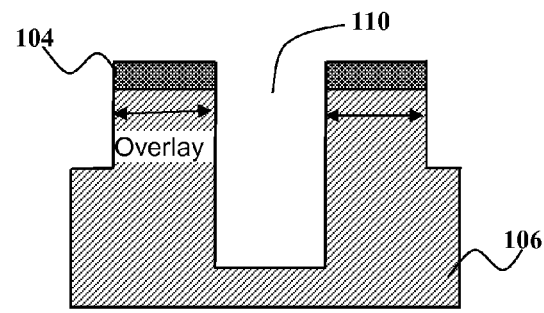
FIG. 1A
(Prior Art)
FIG. 1B
(Prior Art)
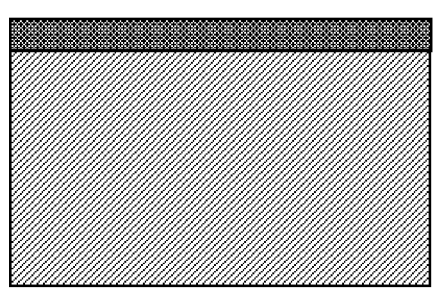
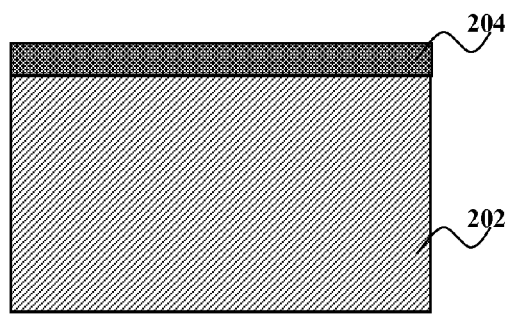
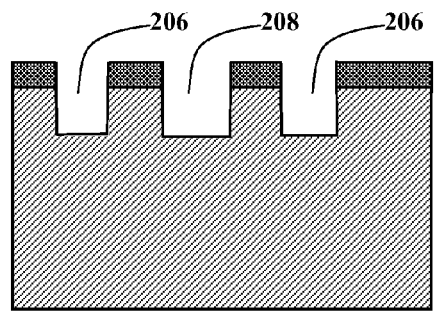
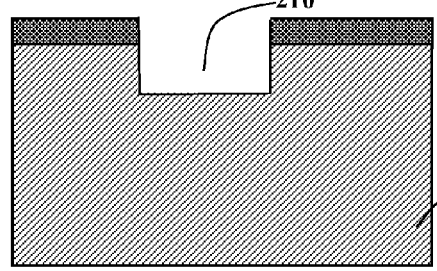
FIG. 2A
FIG. 2B

HIGH DENSITY TRENCH MOSFET WITH SINGLE MASK PRE-DEFINED GATE AND CONTACT TRENCHES

CLAIM OF PRIORITY

This application is a continuation of and claims the priority benefit of commonly-assigned co-pending U.S. patent application Ser. No. 12/362,414 entitled "HIGH DENSITY TRENCH MOSFET WITH SINGLE MASK PRE-DEFINED GATE AND CONTACT TRENCHES" filed Jan. 29, 2009, the entire disclosures of which are incorporated herein by reference.

FIELD OF THE INVENTION

This invention generally relates to high density trench MOSFET devices and more particularly to a method for making gate and contact trenches of the MOSFET devices with a single mask.

BACKGROUND OF THE INVENTION

A MOSFET transistor that includes a trench gate structure offers important advantages over a planar transistor for high current, low voltage switching applications. A trench gate of a MOSFET device typically includes a trench extending from the source to the drain and having sidewalls and a floor that are each lined with a layer of thermally grown silicon dioxide. The lined trench is filled with doped polysilicon. The structure of the trench gate allows less constricted current flow and, consequently, provides lower values of specific on-resistance. Furthermore, the trench gate makes possible a decreased cell pitch in an MOSFET channel extending along the vertical sidewalls of the trench from the bottom of the source across the body of the transistor to the drain below. Channel density is thereby increased, which reduces the contribution of the channel to on-resistance.

A high density trench MOSFET device also includes a contact trench for making contact to source and body regions. Conventional processes for manufacturing of the high density trench MOSFET devices have used two independent masks for making gate trenches and contact trenches. FIG. 1A and FIG. 1B are cross-sectional views illustrating fabrication of a gate trench and contact trench of a vertical MOSFET structure of the prior art. As shown in FIG. 1A, a gate trench mask 102 is used to make a vertical gate trench 108. In a separate step, shown in FIG. 1B, a trench contact mask 104 is used to make a contact trench 110 on a same substrate 106 after the gate trench 108 has been formed. However, a mask overlay issue occurs when two masks 102 and 104 are used to form a vertical MOSFET structure because a well controlled spacing between the gate trench and nearby contact trench is required for high density MOSFET devices, which have increasingly smaller dimensions.

Schemes based on self-alignment processes have been proposed to solve this mask overlay issue. However, these proposed schemes, which use various constructs of alternating oxide and nitride blocking planar or sidewall spacers to create a contact trench that is self-aligned to the gate trench, are complicated to implement. In addition, the spacers may have uniformity problems, wherein spacers at the wafer center may be thicker or thinner than those at the wafer edge.

It is within this context that embodiments of the present invention arise. It would be desirable to develop a process which would use a single mask to pre-define both gate and contact trenches without using complicated multiple spacer approaches.

BRIEF DESCRIPTION OF THE DRAWINGS

Objects and advantages of the invention will become apparent upon reading the following detailed description and upon reference to the accompanying drawings in which:

FIGS. 1A-1B are cross-sectional views illustrating fabrication of gate trench and contact trench according to the prior art.

DESCRIPTION OF THE SPECIFIC EMBODIMENTS

Figure 2C:
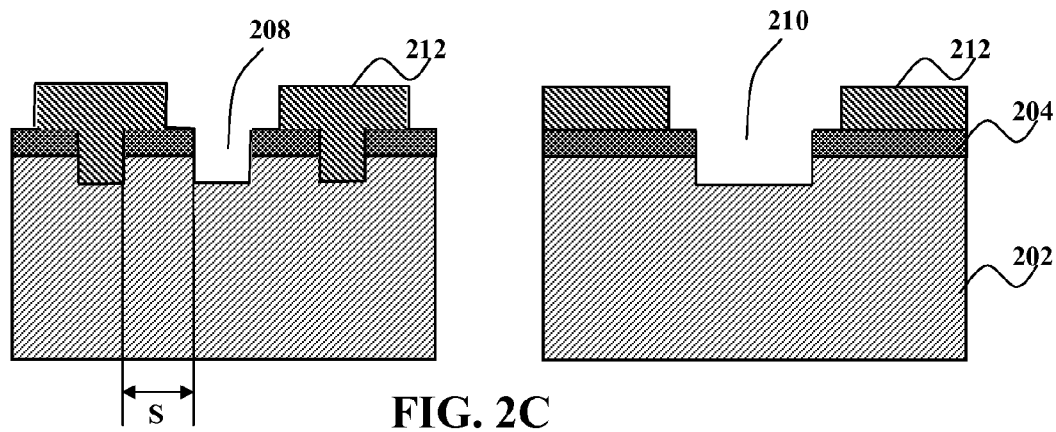
FIGS. 2A-2T are cross-sectional views illustrating a process of making gate trench and contact trench of a high density MOSFET device according to an embodiment of the present invention.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention present a process that uses a single mask to define both gate and contact trenches without utilizing complicated multiple spacer approaches. An example of a fabrication process according to an embodiment of the present invention is shown in FIGS. 2A-2T.

The process uses a semiconductor substrate 202 as a starting material. The substrate 202 may be divided into multiple die. Each die may include an active cell area 201 and a gate pickup/contact area 203 at the periphery of a die as shown in FIG. 2A. Generally, the active cell area 201 contains multiple cells (e.g., MOSFET cells) having the same or similar structure. For the sake of example, a single cell is shown in the active area 201. This is done to illustrate the general fabrication process and is not meant as a limitation on any embodiment of the invention.

A hard mask 204, made of a suitable material (e.g., oxide,) is formed on top of the semiconductor substrate 202. The thickness of the hard mask 204 may be about 0.3 um. A background trench photoresist (not shown) is formed on the hard mask 204 and patterned to define a pattern for the trenches. Body contact trenches 206 and gate trenches 208 are formed on the active cell area 201 and gate contact trenches 210 are formed on the gate pickup/contact area 203 by etching away portions of the hard mask 204 that are exposed to an etchant through openings in the photoresist and then etching corresponding portions of the underlying semiconductor substrate 202 to a first predetermined depth of, e.g., about 0.3 um as shown in FIG. 2B. The photoresist may or may not be removed during etching of the exposed portions of the underlying semiconductor substrate 202. This first masking step predefines the gate trenches, gate contact trenches and body contact trenches. Since the trenches 206,208, 210 are all aligned in a common masking step, issues of non-uniform trench spacing across a wafer that are inherent to self-alignment processes employing spacers may be avoided.

Figure 2D:
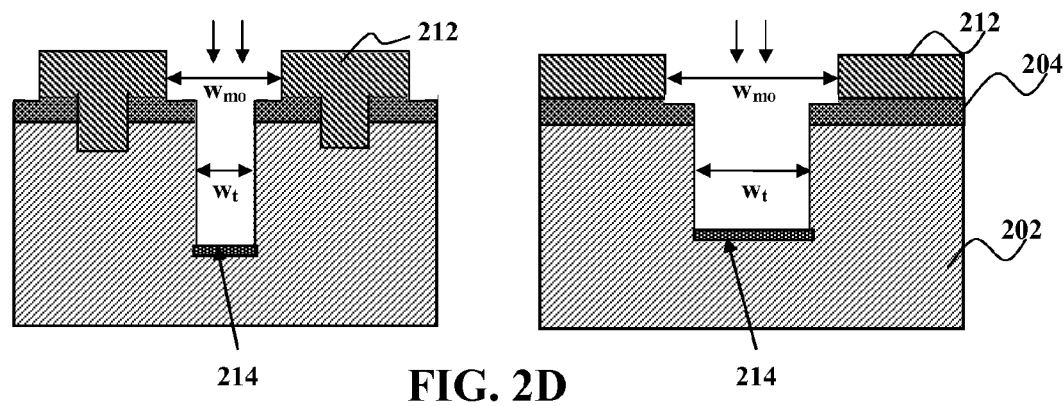

As shown in FIG. 2C, a gate trench mask 212, e.g., a patterned layer of a resist, such as a photoresist, may be deposited and patterned on top of the hard mask 204. The gate trench mask 212 includes openings at the gate trenches 208 and gate contact trenches 210 with the openings being larger than the dimensions of the trenches 208, 210. The remaining portions of the gate trench mask 212 cover the body contact trenches 206 to protect them during a subsequent etch step. As shown in FIG. 2D, the trenches 208 and 210 are then simultaneously etched deeper into the semiconductor substrate 202 to a second predetermined depth. Because the openings in the gate trench mask 212 have wider widths $w_{mo}$ than the widths $w_t$ of the corresponding trenches, and because the hard mask 204 has already predefined all trench locations the gate trench mask 212 can have a relatively large alignment budget. As a result, overlay issues may be made much more manageable than in the prior art. The openings may be made wide since the edges of the trenches 208, 210 are protected during etching by the hard mask 204. In general, the mask openings may be made as wide as desired, provided that they do not expose body contact trenches 206 to undesired etching.

The ability to initiate simultaneous fabrication of the gate trenches and body contact trenches for trench gate MOSFET devices demanding a higher packing density of unit cells with a single mask and to form the gate trenches with a second mask having loose alignment tolerances is particularly advantageous when a high degree of trench spacing uniformity across the wafer is critical in order to achieve stable and consistent device characteristics, e.g. the threshold voltage, in the active cell area 201. By way of example, control of the spacing between the body contact trenches 206 and the gate trenches 208 may become critical when a spacing S between them is less than about 0.3 microns, e.g., about 0.25 microns or less.

By way of example, and not by way of limitation, the trenches 208, 210 may be etched at a sufficient taper angle, e.g., about 87 degrees, to facilitate gate material backfilling in the trenches, e.g., polysilicon gapfilling. Preferably, the hard mask 204 is selectively etched at a much lower rate than the semiconductor substrate 202. By way of example, and not by way of limitation, the substrate may be preferentially etched with an etch selectivity between about 30:1 and about 40:1 relative to the hard mask 204. Because the gate trench mask 212 covers the body contact trenches 206, these trenches are protected from the etch process and are not deepened by the etch process. Because the hard mask 204 is etched at a lower rate than the substrate 202 the etching deepens the trenches 208, 210 but does not affect the edges of the trenches, which are protected by the hard mask 204. After etching, a thick layer of insulating material 214, such as an oxide, may optionally be formed at the bottoms of the trenches 208 and 210 to form a thick bottom oxide for the gate.

Figure 2E:
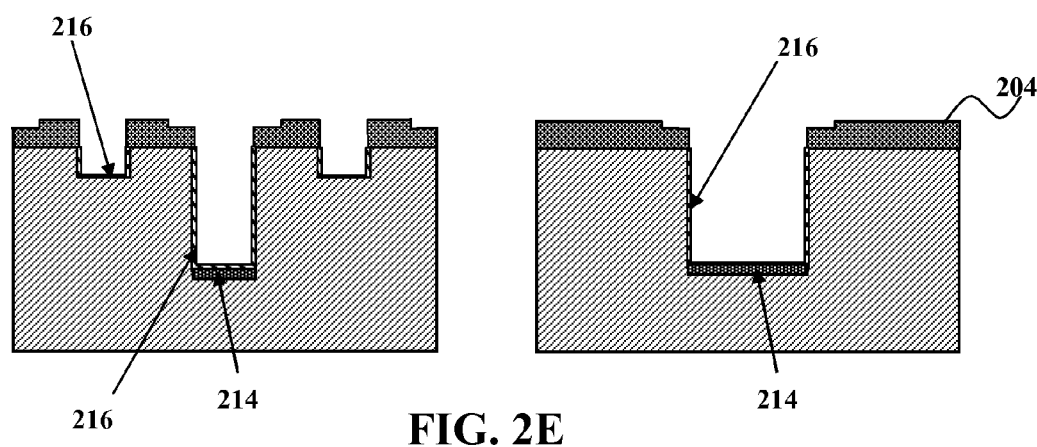

The gate trench mask 212 is then removed as shown in FIG. 2E. A unique silicon round hole etch, e.g., an isotropic silicon etch, may be carried out to round off the trench bottom corners to extend the bottom of the trench to the lateral direction and the vertical direction. A layer of gate insulating material 216 may be formed, e.g., by an oxidation reaction that forms a gate oxide layer after a standard sacrificial oxide growth and etch cycle on the sidewalls and the bottoms of the trenches 208 and 210.

Figure 2F:
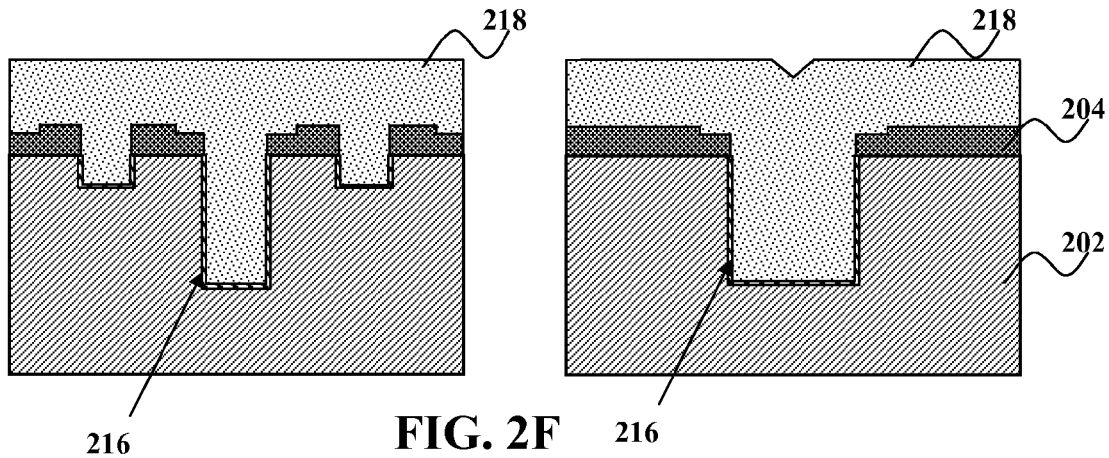
Figure 2G:
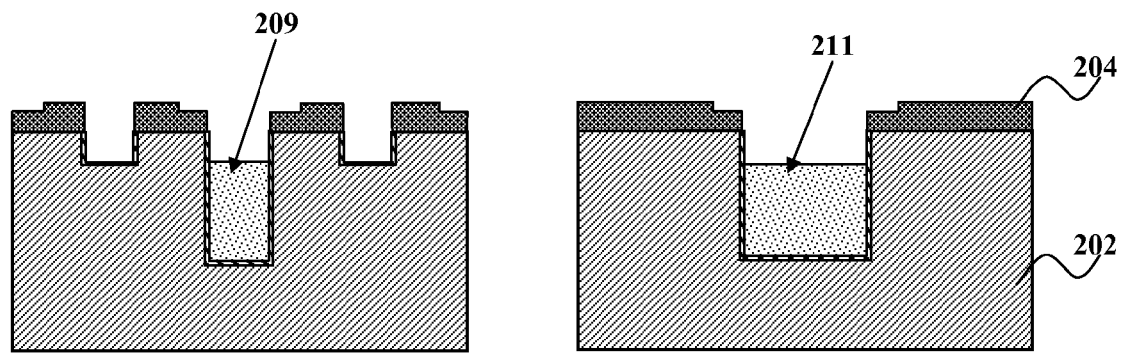

A conductive material 218, e.g., in-situ doped or undoped polysilicon, is deposited to fill in the trenches 208 and 210 as shown in FIG. 2F. The thickness of the conductive material 218 is such that it will completely fill up all trenches, e.g., 1.2 microns in one design and 0.8 microns in another. The conductive material layer 218 may then be etched back to target depth either above, at, or below the surface of semiconductor substrate 202. As shown in FIG. 2G, the conductive layer 218 may be etched back below the semiconductor substrate's surface to form a gate 209 in the gate trench and gate contact 211 in the gate contact trench. In some cases, two or more conductive materials may be used to form these contacts.

Figure 2H:
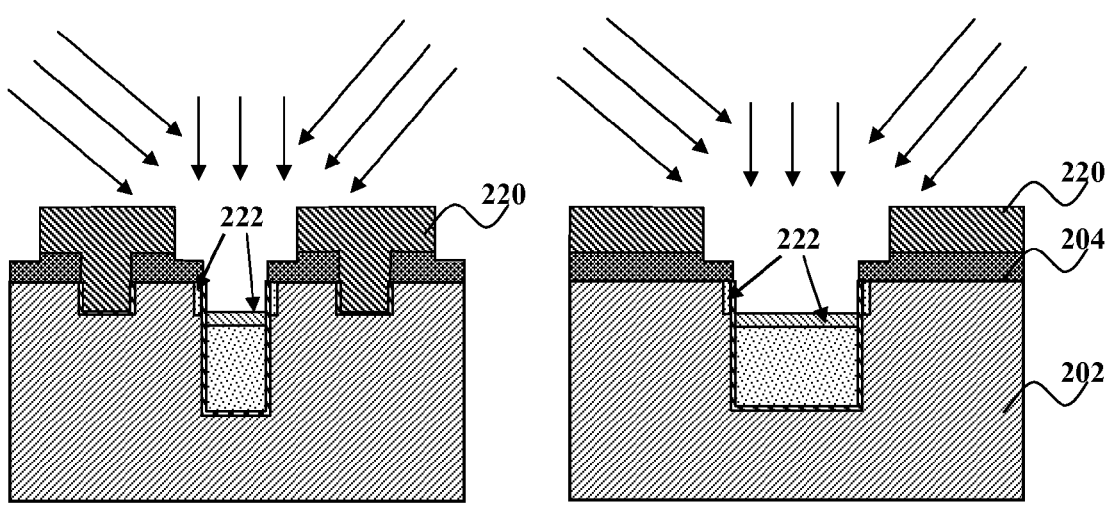

As shown in FIG. 2H, a gate trench mask 220, e.g., a photoresist, may be deposited and patterned on top of the hard mask 204. The gate trench mask 220 includes openings at the locations of the gate trench 208 and the gate contact trench 210. The conductive material 218 forming the gate 209, and gate contact 211 and portions of the sidewalls of the trenches 208 and 210 that are not covered by the conductive material 218 may optionally be implanted with suitable dopant species 222, such as Arsenic (As), Phosphorus (P), or Boron (B). The dopants 222 may be implanted perpendicular or at an oblique angle, e.g., 85 degrees, relative to the substrate surface, so that dopants may be implanted into the sidewalls of the trenches 208, 210. Angled dopant implantation into sidewalls of the trenches may provide a more consistent control of channel resistance and device threshold voltage.

Figure 2I:
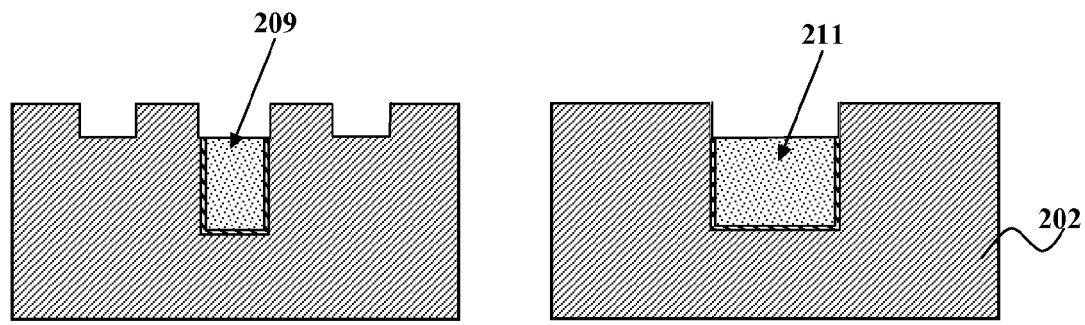
Figure 2J:
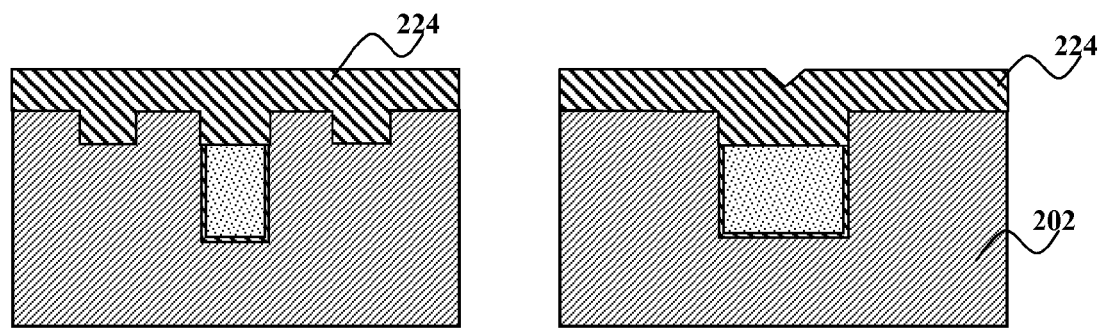
Figure 2K:
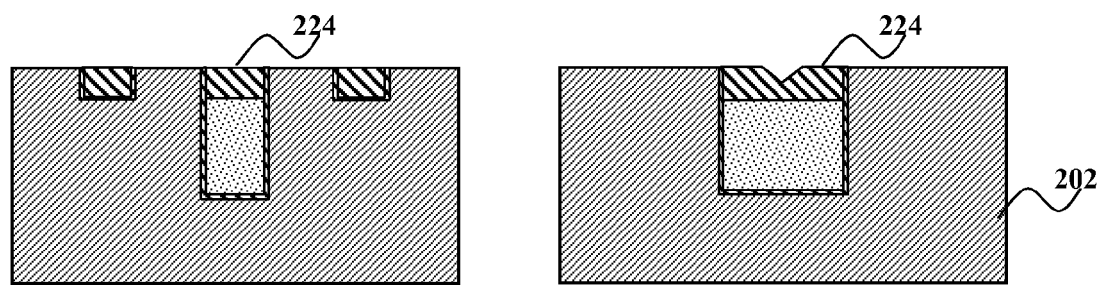

As shown in FIG. 2I, the gate trench mask 220 and the hard mask 204 are removed. The hard mask 204 may be removed using dry etch or wet dip. Uncovered portions of the gate insulating layer 216 may also be removed. An insulating layer 224 may then be formed on top of the semiconductor substrate 202 and the conductive material forming the gate 209 and gate contact 211 as shown in FIG. 2J. By way of example, and not by way of limitation, the insulating layer 224 may be an oxide layer deposited using chemical vapor deposition (CVD). The pad insulating layer 224 may then be etched back to target depth at the surface of the semiconductor substrate 202 surface as shown in FIG. 2K. Alternatively, the insulating layer 224 may be removed by Chemical Mechanical Polishing (CMP).

Figure 2L:
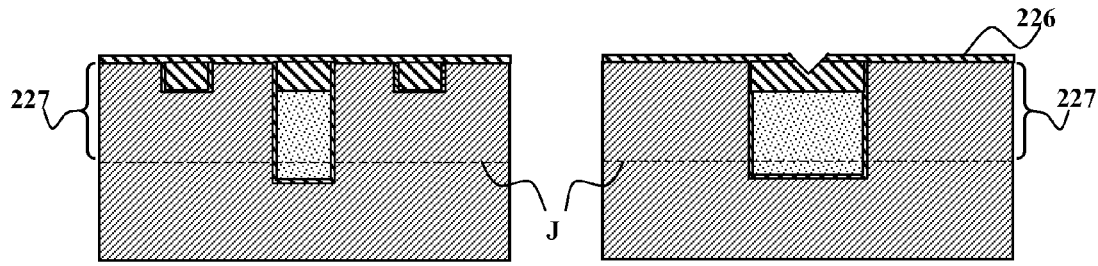

A pad insulating layer 226 with a thickness of about 200 Å is then grown or deposited on top of the structure for ion implantation. A body photo mask (not shown) is applied on the pad insulating layer 226 for body implantation. Dopants are then implanted into the top portions of the semiconductor substrate 202 and heat is applied to activate dopant atoms and drive dopant diffusion to form a body region 227 (e.g., a p-type or n-type body region depending on the type of dopants implanted) in the substrate 202 as shown in FIG. 2L. The heat treatment also drives dopants to a target p/n junction J indicated by a dashed line.

Figure 2M:
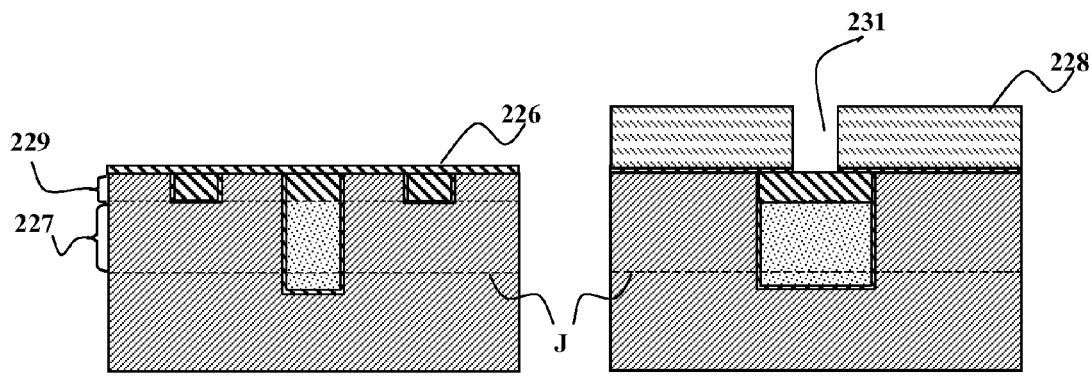

A source mask 228 with a gate contact opening 231 may be applied on top of the pad insulating layer 226. The source mask 228 may cover the gate pickup/contact area 203 and leave the active cell area 201 uncovered for source implantation. Then, standard source dopant implant may be performed through exposed portions of the pad insulating layer 226 and diffusion processes may be carried out to form the source regions 229 in the active cell area 201 as shown in FIG. 2M. These processes may be identical to corresponding stages of the current standard trench MOSFET process.

Figure 2N:
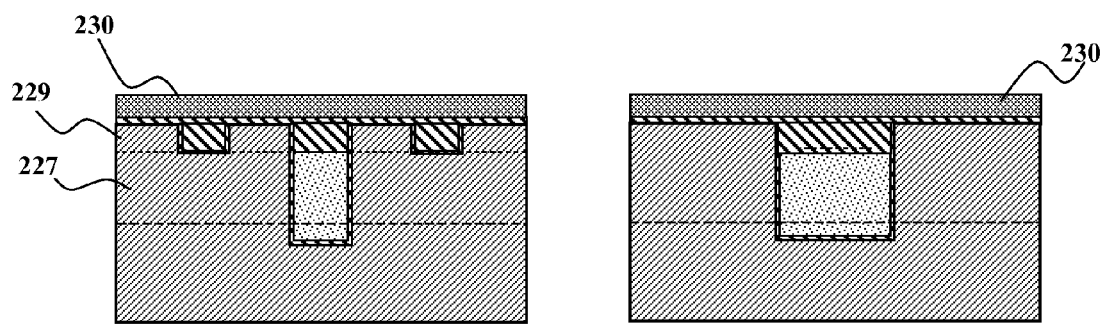

As shown in FIG. 2N, the source mask 228 is then removed. An inter-layer dielectric (ILD) layer 230 may then be deposited over the surface of the semiconductor substrate 202. The thickness of the ILD layer 230 may be about 0.2 um. The ILD layer 230 can be formed by a low temperature oxidation process with material of silicon oxide, tetraethyl orthosilicate (TEOS), phosphosilicate glass (PSG), borophosphosilicate glass (BPSG) or any combination of above.

Figure 2O:
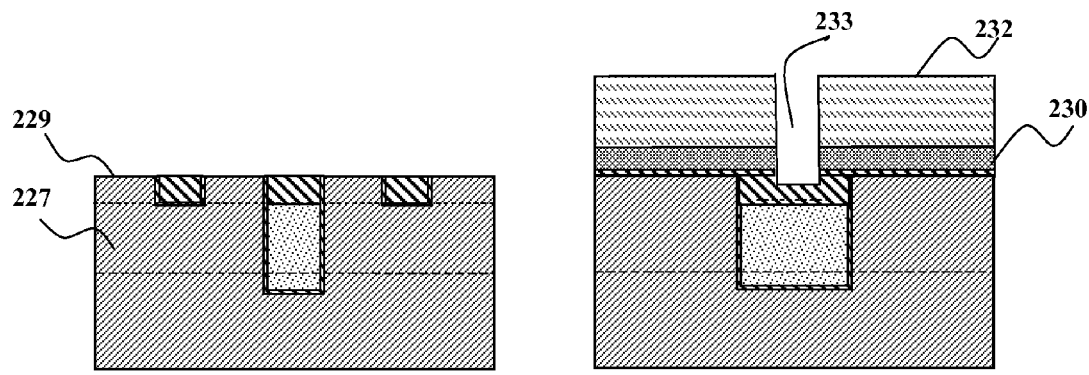
Figure 2P:
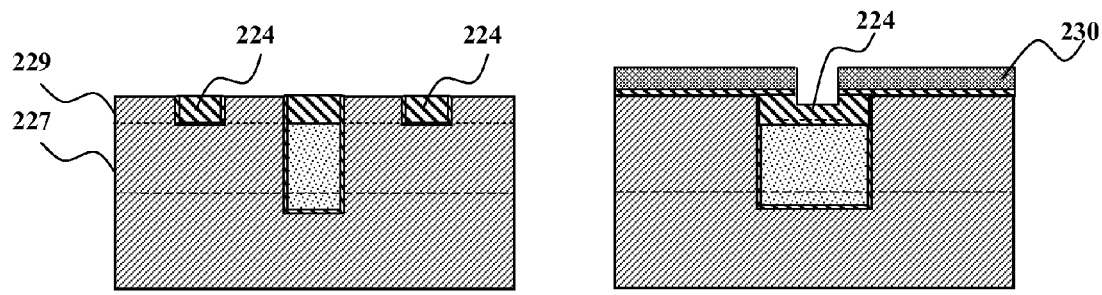

As shown in FIG. 2O, second source mask 232 having a gate contact opening 233 on top of the gate contact 211 is applied on top of the gate pickup/contact area 203 with the active cell area 201 uncovered. The mask 232 may have the same pattern as the source mask 228. By way of example, a common mask e.g., a photomask, may be used to pattern both masks 228, 232. The ILD layer 230 may then be removed from the active cell region 201 and from beneath the opening 233 in a subsequent etch step. The mask 232 may then be removed as shown in FIG. 2P.

Figure 2Q:
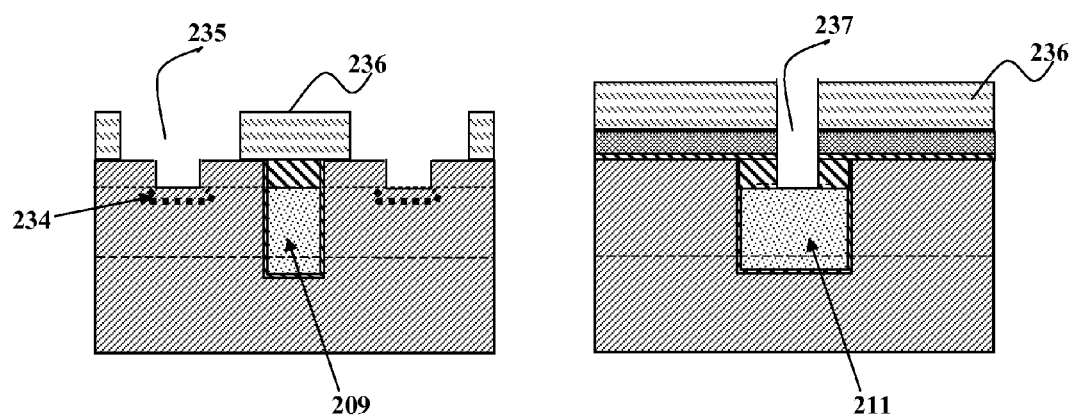

As shown in FIG. 2Q, a contact photo mask 236 may be applied on top of the active cell area 201 and the gate pickup/contact area 203. The contact photo mask 236 includes openings 235 that are wider than the body contact trenches 206 and an opening 237 narrower than the gate contact 211. The contact mask 236 covers the gate 209 to protect it during a subsequent etch step. The insulating material 224 may then be etched back and the etching stopped at the surface of the semiconductor substrate 202. Then, standard processes of contact implant and diffusion may be carried out to form contact regions 234 proximate to the bottoms of the contact trenches 206 as shown in FIG. 2Q. The contact implant also goes into portions of the source region 229. However, since the source region 229 is much more heavily doped (e.g., 2-3 orders of magnitude higher), the body contact implant does not affect the doping of the source region 229.

Figure 2R:
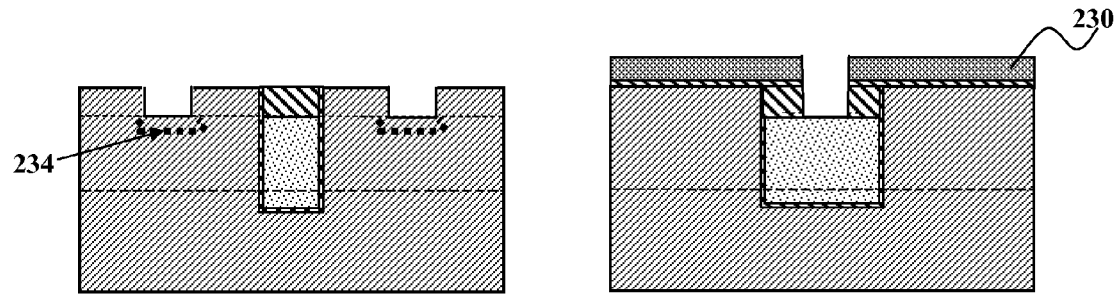
Figure 2S:
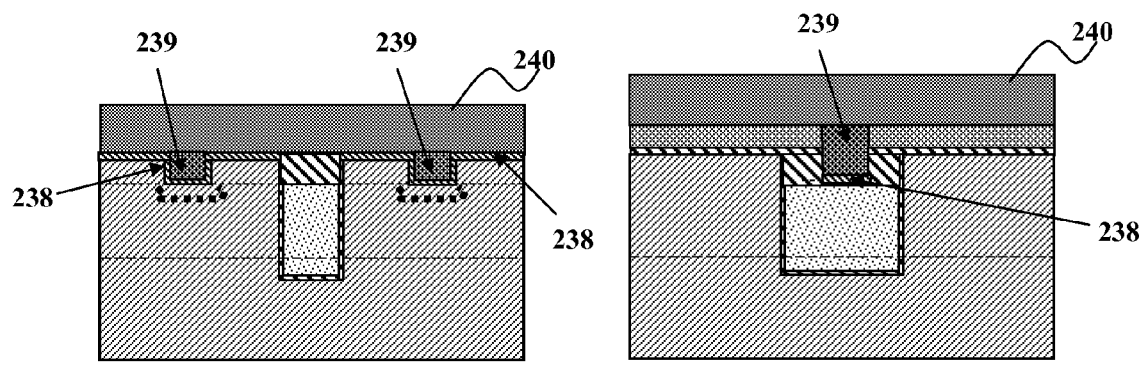
Figure 2T:
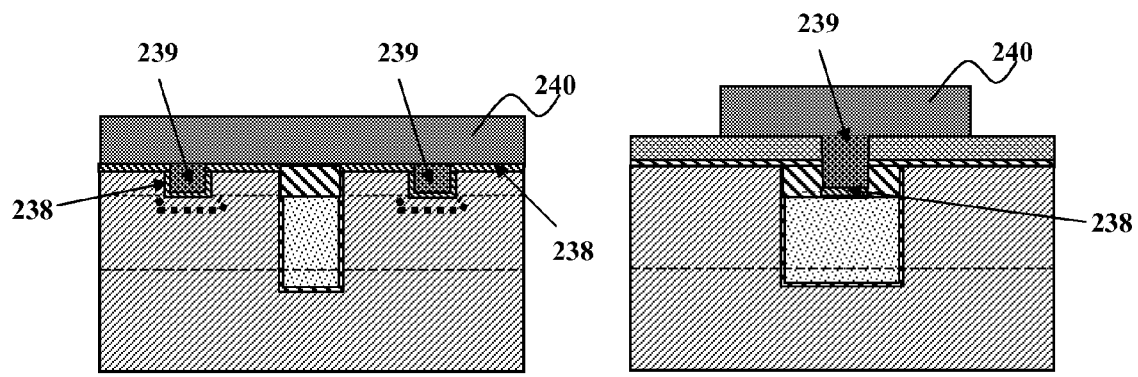

The contact photo mask 236 is then stripped as shown in FIG. 2R. Optionally, the top surface of the semiconductor substrate 202 is slightly etched to remove dopant-induced damage. A subsequent light etch may be performed to remove insulating material remaining on top of source region 229, in the body contact trenches 206 and under the opening 237 above the gate contact 211. Titanium (Ti) and Titanium Nitride (TiN) may now be blanket deposited and then followed by silicidation to form a Titanium Silicide (TiSi$_x$) layer 238 as shown in FIG. 2S. A conductive material 239, such as Tungsten (W), may then be blanket deposited in the trenches 206 and 210 and then etched back to form conductive plugs. Finally, a metal layer 240, such as AlCu, is blanket deposited on top of the active cell area 201 and the gate pickup/contact area 203 and patterned. In the active cell area 201, the metal layer 240 contacts the source and body.

As shown in FIG. 2T, a metal photo mask (not shown) may be applied for patterning metal layer 240. The photoresist may be stripped after etching.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for forming vertical gate and gate contact for a trench MOSFET device, comprising:
    a) forming a hard mask layer on a surface of a semiconductor substrate having an active cell area;
    b) applying a trench mask on the hard mask layer, wherein the trench mask defines a body contact trench and a gate trench at the active cell area;
    c) simultaneously etching the body contact trench and the gate trench into the semiconductor substrate to a first predetermined depth;
    d) applying a first gate trench mask on top of the hard mask layer, the gate trench mask having openings at the gate trench but not the body contract trench;
    e) etching the gate trench but not the body contact trench deeper into the semiconductor substrate to a second predetermined depth; and
    f) forming conductive material in the gate trench to form a gate.

2. The method of claim 1, wherein the hard mask layer in a) is an oxide layer.

3. The method of claim 1, wherein a ratio of the etching rate of the semiconductor substrate to the etching rate of the hard mask layer is between 30:1 and 40:1.

4. The method of claim 1, further comprising, after e), forming a thick bottom insulating layer on a bottom of the gate trench.

5. The method of claim 1, wherein f) comprises:
    etching round holes at bottoms of the body contact trench and the gate trench;
    forming a gate insulating layer on bottoms and sidewalls of the body contact trench and the gate trench;
    at least partially filling the body contact trench and the gate trench with the conductive material; and
    etching back the conductive material to a target depth.

6. The method of claim 5, further comprising, after f):
    applying a second gate trench mask on top of the hard mask layer, the gate trench mask having openings at locations of the gate trench;
    implanting dopants through the openings into portions of the conductive material in the gate trench and into the sidewalls of portions of the gate trench that are not covered by the conductive material;
    removing the second gate trench mask;
    removing the hard mask layer;
    removing the gate insulating material from the body contact trench and at the sidewalls of portions of the gate trench that are not filled with the conductive material;
    filling the body contact trench and the gate trench with an insulating material; and
    etching back the insulating material and stopping at the surface of the semiconductor substrate.

7. The method of claim 6, wherein the dopants are implanted at an oblique angle.

8. The method of claim 1, further comprising:
    g) forming a body region at a portion at the surface of the semiconductor substrate; and
    h) forming a source region in a portion at a surface of the body region in the active cell area.

9. The method of claim 8, wherein g) comprises:
    depositing a pad insulating layer on the surface of the semiconductor substrate;
    heating the substrate to a sufficient temperature to drive diffusion and anneal the pad insulating layer; and
    implanting dopants into the surface through the pad insulating layer to form a body region at portions of the semiconductor substrate.

10. The method of claim 8, further comprising:
    i) forming a metal layer over the active area in electrical contact with the source and with a body contact formed in the body contact trench.

11. The method of claim 8, further comprising:
    applying a contact mask on the surface of the semiconductor substrate at the active cell area;
    implanting dopants to form body contact regions at portions at a surface of the body region proximate the bottom of the body contact trench;
    removing the contact photo mask;
    depositing a conductive material into the body contact trench and etching back the conductive material;

depositing a metal layer on the surface of the semiconductor substrate at the active cell area.

12. The method of claim 1 wherein the gate trench and the body contact trench are separated by a distance less than 0.3 microns.

13. The method of claim 1 wherein the substrate includes a gate pickup/contact area, wherein the trench mask also defines a gate contact trench at the gate pick up area, wherein c) includes simultaneously etching the body contact trench, the gate trench and the gate contact trench into the semiconductor substrate to the first predetermined depth, wherein d) includes applying a first gate trench mask on top of the hard mask oxide layer, the gate trench mask having openings at the gate trench and the gate contract trench but not the body contract trench, wherein e) includes simultaneously etching the gate trench and the gate contact trench but not the body contact trench deeper into the semiconductor substrate to the second predetermined depth, and wherein f) includes forming conductive material in the gate trench and the gate contact trench to form the gate and a gate contact respectively.

14. The method of claim 13 wherein f) comprises:

etching round holes at bottoms of the body contact trench, the gate trench and the gate contact trench;

depositing a gate insulating layer on bottoms and sidewalls of the body contact trench, the gate trench and the gate contact trench to form gate insulator;

at least partially filling the body contact trench, the gate trench and the gate contact trench with conductive material; and etching back the conductive material to a target depth.

15. The method of claim 14, further comprising, after f):

applying a second gate trench mask on top of the hard mask layer, the gate trench mask having openings at locations of the gate trench and the gate contact trench;

implanting dopants through the openings into portions of the conductive material in the gate trench and gate contact trench and into the sidewalls of portions of the gate trench and gate contact trench that are not covered by the conductive material;

removing the second gate trench mask;

removing the hard mask layer;

removing gate insulating material from the body contact trench and the sidewalls of the gate trench and gate contact trench that are not covered with the conductive material;

filling the body contact trench, the gate trench with an insulating material; and etching back the insulating material and stopping at the surface of the semiconductor substrate.

16. The method of claim 13, further comprising:

g) forming a body region at a portion at the surface of the semiconductor substrate; and h) forming a source region in a portion at a surface of the body region in the active cell area using a first source photo mask.

17. The method of claim 16, further comprising;

i) forming a metal layer over the active area and gate pick up area in electrical contact with the gate contact and the source and a body contact formed in the body contact trench.

18. The method of claim 16, further comprising:

depositing an inter-layer dielectric (ILD) layer on the surface of semiconductor substrate;

applying a second source photo mask on a surface of the ILD layer in the gate pick up area, the second source mask having an opening at the gate contact trench, wherein the opening is narrower than the gate contact trench's width;

removing the ILD layer in the active cell region and etching back the ILD layer at the opening at the gate contact trench to the surface of the semiconductor substrate; and removing the second source mask.

19. The method of claim 18, further comprising:

applying a contact mask on the surface of the semiconductor substrate at the active cell area and on a surface of the ILD layer at the gate pick up area, wherein the contact mask has openings at locations of the body contact trench and an opening at the gate contact trench;

removing a portion of an insulating layer under the opening at the gate contact trench;

implanting dopants to form one or more body contact regions at portions at a surface of the body region proximate the bottoms of the body contact trenches;

removing the contact photo mask;

depositing a conductive material into the body contact trench and gate contact trench and etching back the conductive material;

depositing a metal layer on the surface of the semiconductor substrate at the active cell area and on top of the ILD layer at the gate pick up area;

applying a metal mask on top of the metal layer;

etching the metal layer at the gate pick up area; and removing the metal mask.

20. The method of claim 19 wherein the first source mask and the second source mask have the same mask pattern.

* * * * *